(12) United States Patent
Lin

(10) Patent No.: US 7,367,691 B2
(45) Date of Patent: May 6, 2008

(54) OMNIDIRECTIONAL ONE-DIMENSIONAL PHOTONIC CRYSTAL AND LIGHT EMITTING DEVICE MADE FROM THE SAME

(75) Inventor: Chung-Hsiang Lin, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 18 days.

(21) Appl. No.: 10/688,625

(22) Filed: Oct. 17, 2003

(65) Prior Publication Data

US 2004/0252509 A1  Dec. 16, 2004

(30) Foreign Application Priority Data

Jun. 16, 2003  (TW) ............................... 92116298 A

(51) Int. Cl.
*H01L 33/00* (2006.01)
(52) U.S. Cl. .................. 362/293; 257/98; 359/584; 359/587
(58) Field of Classification Search ........... 362/293; 257/98; 359/584, 359, 237, 587, 580, 577, 359/578
See application file for complete search history.

(56) References Cited

U.S. PATENT DOCUMENTS

| 5,740,287 A | 4/1998 | Scalora et al. ................. 385/6 |
| 5,813,753 A | 9/1998 | Vriens et al. ................ 362/293 |
| 6,130,780 A | 10/2000 | Joannopoulos et al. ..... 359/584 |
| 6,155,699 A | 12/2000 | Miller et al. ................ 362/293 |
| 6,624,945 B2 * | 9/2003 | Fan et al. ................... 359/584 |
| 2003/0210448 A1 * | 11/2003 | Buchwald ................... 359/237 |
| 2004/0119083 A1 * | 6/2004 | Su et al. ....................... 257/98 |

FOREIGN PATENT DOCUMENTS

| DE | 2300790 | 8/1973 |
| DE | 3941859 | 1/1991 |
| JP | 11145519 | 5/1999 |
| WO | WO 02/15292 | 2/2002 |

OTHER PUBLICATIONS

Fink et al, A dielectric omnidirectional reflector, Nov. 27, 1998, PUBMED.gov.*
Kaminska et al, Birefringement omnidirectional reflector, Mar. 1, 1994, Applied Optics.*
Chen, Sparks, Luan, Lim, Wada and Kimerling, "$SiO_2/TiO_2$ Omnidirectional Reflector and Microcavity Resonator via the Sol-gel Method", Applied Physics Letter, vol. 75, No. 24, pp. 3805-3807, Dec. 13, 1999.
Ishino, Miura, Satao, Ohtera, Kawashima, Ohkubo and Kawakami, "Low-loss Propagation Through $Ta_2O_5/SiO_2$ Lattice-modulated Photonic Crystal Waveguide", New Industry Creation Hatchery Center, Tohoku Univ., 2002.

* cited by examiner

*Primary Examiner*—Thomas M. Sember
(74) *Attorney, Agent, or Firm*—Jianq Chyun IP Office

(57) ABSTRACT

A light emitting device includes a light-generating unit for generating a primary light in a first wavelength range, a wavelength-converting member connected to the light-generating unit for converting a portion of the primary light into a secondary light in a second wavelength range, and an omnidirectional reflector connected to the wavelength-converting member for receiving the secondary light and the remainder of the primary light which was not converted by the wavelength-converting member. The omnidirectional reflector is made from an omnidirectional one-dimensional photonic crystal having a reflectance characteristic that substantially permits total reflection of the remainder of the primary light with any incident angle and polarization back to the wavelength-converting member.

9 Claims, 11 Drawing Sheets

OMNIDIRECTIONAL ONE-DIMENSIONAL PHOTONIC CRYSTAL AND LIGHT EMITTING DEVICE MADE FROM THE SAME

CROSS-REFERENCE TO RELATED APPLICATION

This application claims priority of Taiwanese Application No. 092116298, filed on Jun. 16, 2003.

BACKGROUND OF THE INVENTION

1. Field of the Invention

This invention relates to an omnidirectional one-dimensional photonic crystal and a light emitting device made from the same.

2. Description of the Related Art

U.S. Pat. No. 5,813,753 discloses a light emitting device that includes a UV/blue LED located in a depression having reflecting sidewalls, a light transmitting material surrounding the LED and filling the depression, a phosphor material in the form of particles dispersed in the light transmitting material, and a long-wave pass (LWP) filter formed on a front side of the light transmitting material.

FIG. 1 illustrates a conventional light emitting device 10 that is disclosed in U.S. Pat. No. 6,155,699, and that includes a cup 11 defining a depression 12, a light emitting diode 13 placed in the depression 12, a dome-shaped encapsulating layer 14 encapsulating the light emitting diode 13, a Distributed Bragg Reflector (DBR) mirror 15 surrounding the encapsulating layer 14, a wavelength-converting member 16 surrounding the DBR mirror 15, and a lens 17 encapsulating the wavelength-converting member 16. The DBR mirror 15 is known in the art as a multi-layered dielectric structure having a spatially periodic variation in dielectric constant and exhibiting a frequency photonic bandgap characteristic that prevents propagation of light in a certain frequency range within the dielectric structure and that permits total reflection of the light. The wavelength-converting member 16 is normally made from phosphorescent materials, which are known in the art as an agent for absorbing and converting a primary light (e.g., an invisible or UV/blue light), which has a shorter wavelength range, into a secondary light (e.g., a visible or white light), which has a longer wavelength range. The DBR mirror 15 possesses a transmittance characteristic of transmitting most of the first light therethrough and to the wavelength-converting member 16, and a reflectance characteristic of preventing the second light generated from the wavelength-converting member 16 from entering to the encapsulating layer 14. In use, the light emitting diode 13 emits a primary light that passes through the encapsulating layer 14 and the DBR mirror 15, and that is subsequently converted into a secondary light by the phosphorescent material in the wavelength-converting member 16. A portion of the secondary light exits the light emitting device 10 through the lens 17, while the remainder of the secondary light impinges the DBR mirror 15 and is subsequently reflected by the latter back to the wavelength-converting member 16 so as to prevent the secondary light from entering the encapsulating layer 14, thereby enhancing the efficiency of the light emitting device 10.

Since the amount of the primary light converted into the secondary light depends on the concentration and the quantum efficiency of the phosphorescent materials in the wavelength-converting member 16, a significant amount of the primary light may not be converted and may pass through the wavelength-converting member 16 and the lens 17 and into the air, which results in a decrease in the efficiency of the light emitting device 10 and in the quality of the secondary light, such as color temperature and purity, and which can be harmful to the environment if the primary light is a UV light. Therefore, there is a need for improving efficiency of converting the primary light into the secondary light so as to enhance the efficiency of the light emitting device 10.

The aforesaid DBR mirror and the LWP filter are dielectric structures with pairs of high and low refractive index layers. It is known that the conventional DBR mirrors and the LWP filters do not work so well to reflect or transmit light over a wide range of incident angles relative to a normal line of a surface of the dielectric structure of the DBR mirror or the LWP filter.

U.S. Pat. No. 6,130,780 discloses an omnidirectional reflector that is made from an omnidirectional one-dimensional photonic crystal possessing omnidirectional photonic bandgaps and that is capable of totally reflecting the light with any incident angle and polarization when the frequency (or wavelength) of the incident light falls in said bandgaps. The disclosed reflector consists of pairs of high and low refractive index layers. The reflective index contrast between the two dielectric materials should be high enough to form omnidirectional photonic bandgaps.

The entire disclosures of U.S. Pat. Nos. 6,155,699, 5,813,753, and 6,130,780 are hereby incorporated herein by reference.

SUMMARY OF THE INVENTION

The object of the present invention is to provide a light emitting device with omnidirectional reflectors that is capable of overcoming the aforesaid drawbacks of the prior art.

According to one aspect of the present invention, there is provided a light emitting device that comprises: a light-generating unit for generating a primary light in a first wavelength range; a wavelength-converting member connected to the light-generating unit for converting a portion of the primary light into a secondary light in a second wavelength range; and at least one omnidirectional reflector connected to the wavelength-converting member for receiving the secondary light and the remainder of the primary light which was not converted by the wavelength-converting member. The omnidirectional reflector is a dielectric structure with a spatially periodic variation in dielectric constant, and includes at least one dielectric unit that has at least two dielectric layers which are different from each other in refractive index and layer thickness in such a manner that the reflector has a transmittance characteristic of transmitting the secondary light therethrough, and a reflectance characteristic of substantially reflecting totally of the remainder of the primary light with any incident angle and polarization back to the wavelength-converting member.

According to another aspect of the present invention, there is provided an omnidirectional reflector that comprises a dielectric structure with a spatially periodic variation in dielectric constant. The dielectric structure includes at least one dielectric unit that has three dielectric layers which are different from each other in refractive index and layer thickness in such a manner that the reflector possesses a reflectance characteristic that substantially permits total reflection of a primary light in a first wavelength range, and a transmittance characteristic that permits transmission of a secondary light in a second wavelength range outside the first wavelength range region.

BRIEF DESCRIPTION OF THE DRAWINGS

In drawings which illustrate embodiments of the invention.

DETAILED DESCRIPTION OF THE PREFERRED EMBODIMENTS

Figure 1:
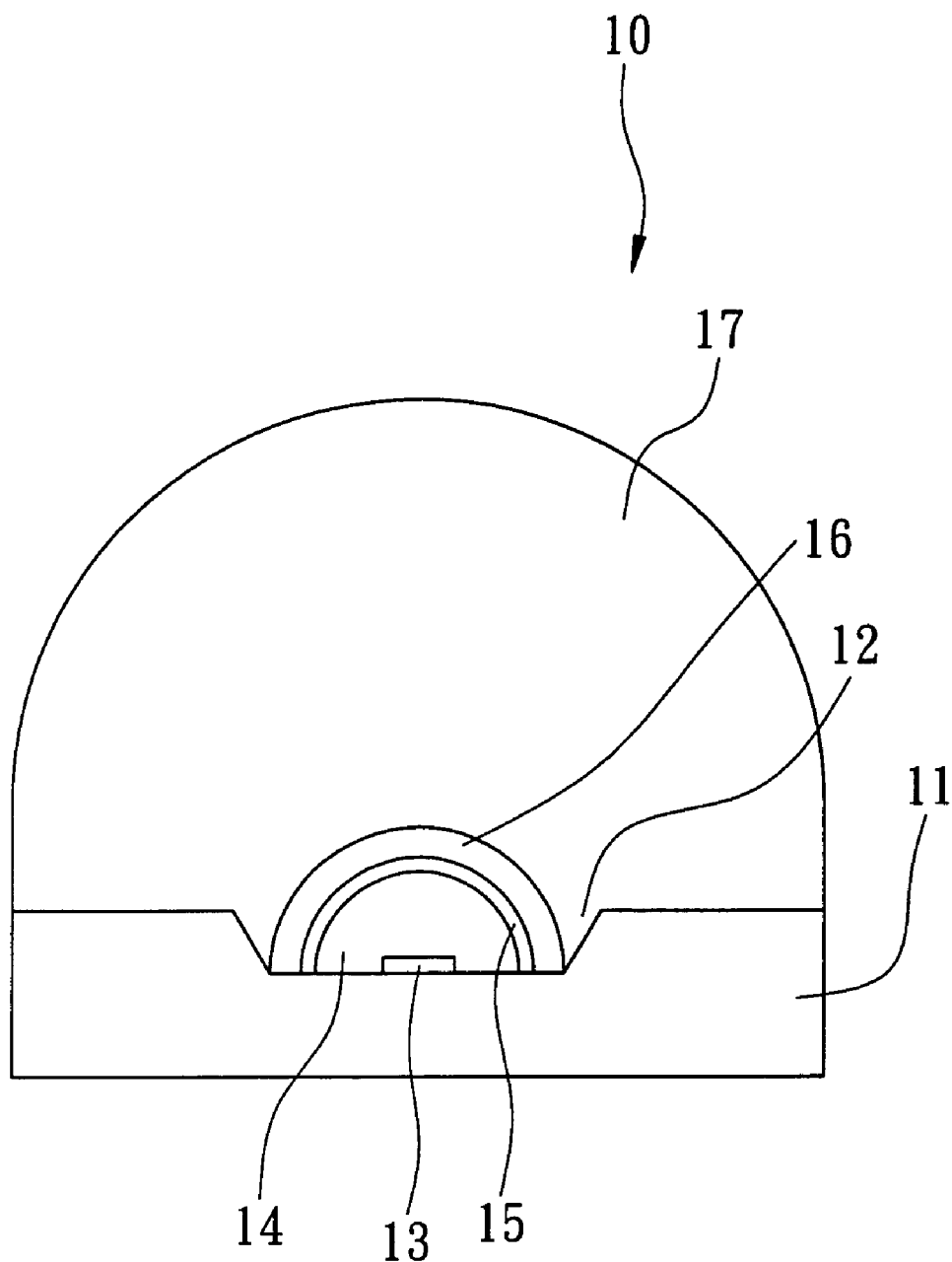
FIG. 1 is a graph of a conventional light emitting device.

For the sake of brevity, like elements are denoted by the same reference numerals throughout the disclosure.

Figure 2:
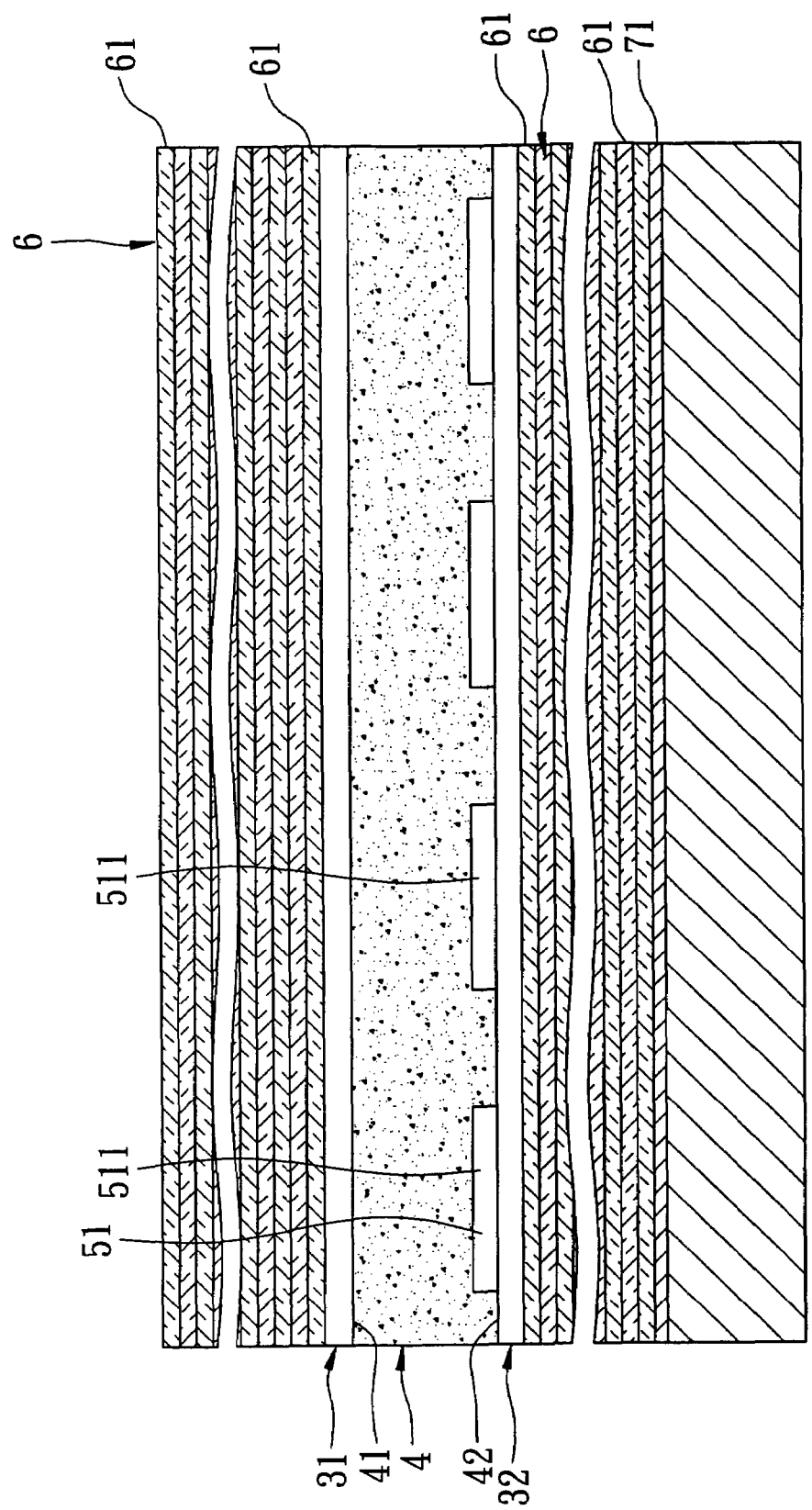
FIG. 2 is a schematic, fragmentary sectional view of the first preferred embodiment of a light emitting device according the present invention.
Figure 3:
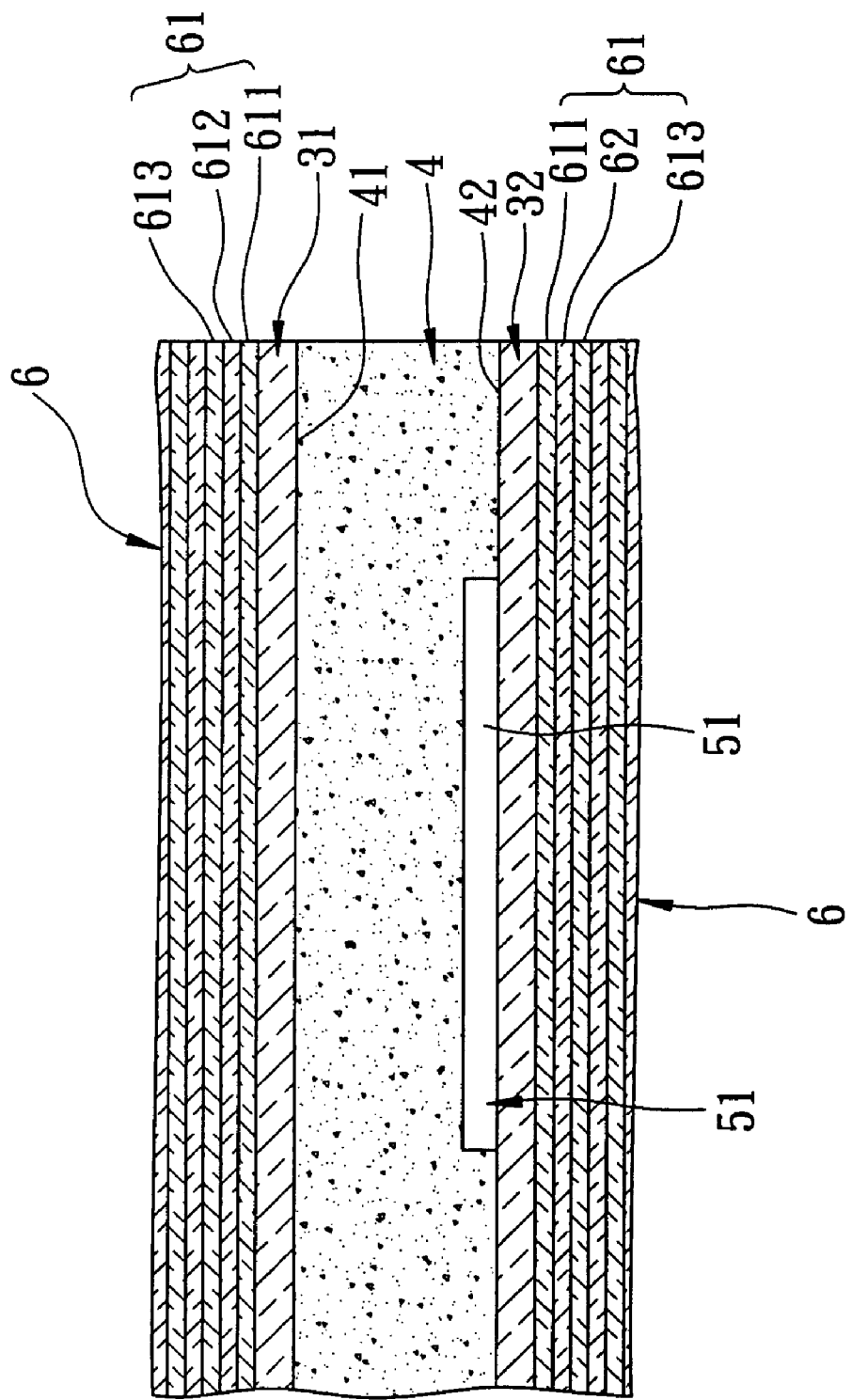
FIG. 3 is a schematic, fragmentary sectional view to illustrate the structure of an omnidirectional reflector of the light emitting device of the first preferred embodiment of the present invention.

FIGS. 2 and 3 illustrate the first preferred embodiment of a light emitting device according to the present invention. The light emitting device includes: a light-generating unit 51, which includes at least one light-generating element 511, for generating a primary light in a first wavelength range; a wavelength-converting member 4 connected to the light-generating unit 51 for converting a portion of the primary light into a secondary light in a second wavelength range; first and second glass substrates 31, 32 sandwiching the wavelength-converting member 4; and first and second omnidirectional reflectors 6 sandwiching the first and second glass substrates 31, 32 therebetween for receiving the secondary light and the remainder of the primary light which was not converted by the wavelength-converting member 4. Each of the first and second omnidirectional reflectors 6 is made from an omnidirectional one-dimensional photonic crystal, and has a transmittance characteristic that permits transmission of the secondary light therethrough, and a reflectance characteristic that substantially permits total reflection of the remainder of the primary light with any incident angle and polarization back to the wavelength-converting member 4. Each of the first and second omnidirectional reflectors 6 is a dielectric structure with a spatially periodic variation in dielectric constant, and includes at least one dielectric unit 61 that includes at least first, second and third dielectric layers 611, 612, 613 which are different from each other in refractive index and layer thickness. The second dielectric layer 612 is sandwiched between the first and third dielectric layers 611, 613, and has a lower refractive index than those of the first and third dielectric layers 611, 613. The third dielectric layer 613 has a lower refractive index than that of the first dielectric layer 611. Note that propagation of light through the dielectric structure is mainly affected by the refractive index and the thickness of each dielectric layer of the dielectric structure. As such, the second dielectric layer 612, which is sandwiched between the first and third dielectric layers 611, 613, is not necessary to have a lower refractive index than those of the first and third dielectric layers 611, 613.

The wavelength-converting member 4 has opposite upper and lower surfaces 41, 42. The light-generating element 511 of the light-generating unit 51 is inlaid in the lower surface 42 of the wavelength-converting member 4. The second glass substrate 32 is attached to the lower surface 42 of the wavelength-converting member 4, and covers the light-generating unit 51. The first glass substrate 31 is attached to the upper surface 41 of the wavelength-converting member 4. The first and second omnidirectional reflectors 6 are respectively attached to the first and second glass substrates 31, 32.

Using UV LED chips as the light-generating unit 51 and phosphors as the wavelength-converting member 4, the light-emitting device of this invention is capable of producing white light.

Figure 10:
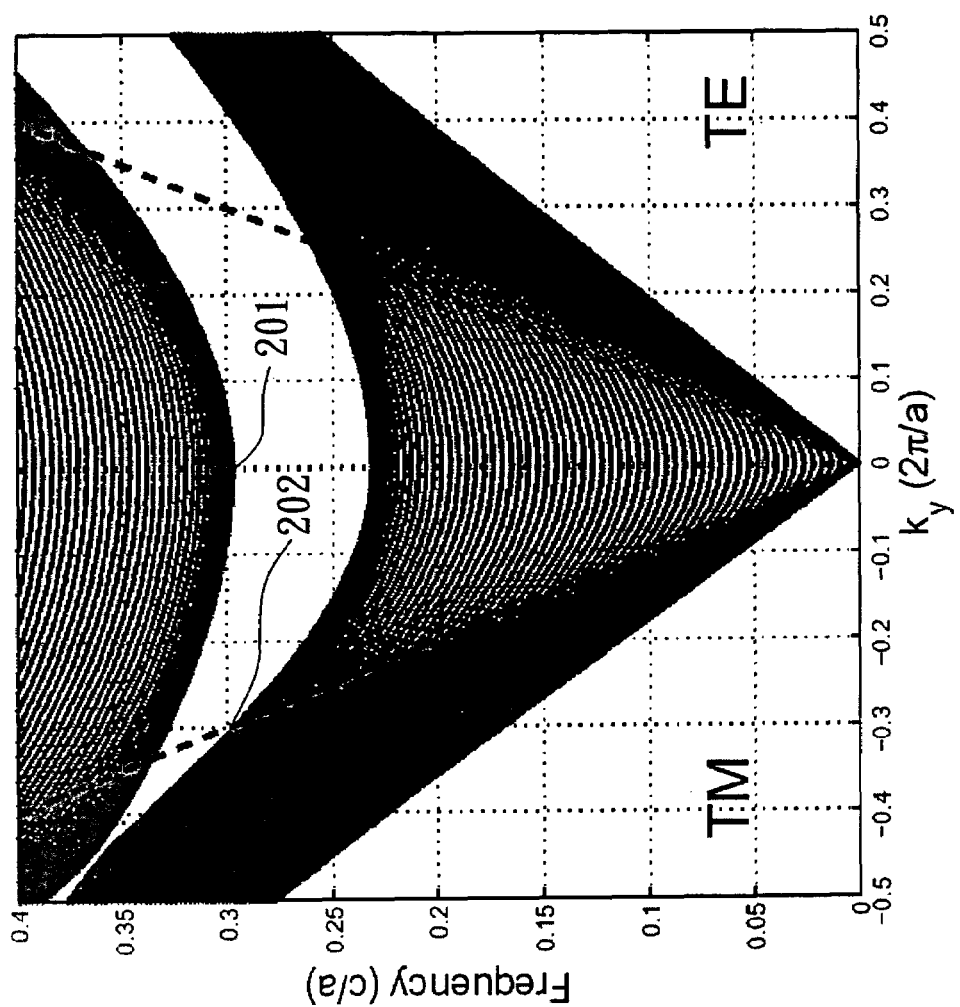
FIG. 10 is a graph showing the photonic band structure of the omnidirectional one-dimensional photonic crystal of the first preferred embodiment of this invention.

In the first preferred embodiment, the first dielectric layer 611 is made from $TiO_2$, the third dielectric layer 613 is made from $Ta_2O_5$, and the second dielectric layer 612 is made from $SiO_2$. Other dielectric materials that can be employed in the reflectors 6 of this invention include $Al_2O_3$, MgO, $ZrO_2$ $MgF_2$, $BaF_2$, and $CaF_2$. FIG. 10 is a graph showing the photonic band structure (frequency vs wave vector, $k_y$) of an omnidirectional one-dimensional photonic crystal made of the first, second and third dielectric layers of 611, 612 and 613. This photonic crystal has an omnidirectional photonic bandgap between the frequencies 0.298 (c/a) and 0.295 (c/a) (i.e., the frequencies corresponding to the point 201 and the point 202 in FIG. 10) for an incidence light with a wavelength in a range of from 369 nm to 373 nm when the lattice spacing of the photonic crystal is 110.0 nm. Definitions of the wave vector ($k_y$) and wave polarizations TE and TM can be found in the specification of U.S. Pat. No. 6,130,780.

In the first preferred embodiment, each of the first and second omnidirectional reflectors 6 includes fourteen periodically disposed dielectric units 61 having the band structure shown in FIG. 10.

Figure 11:
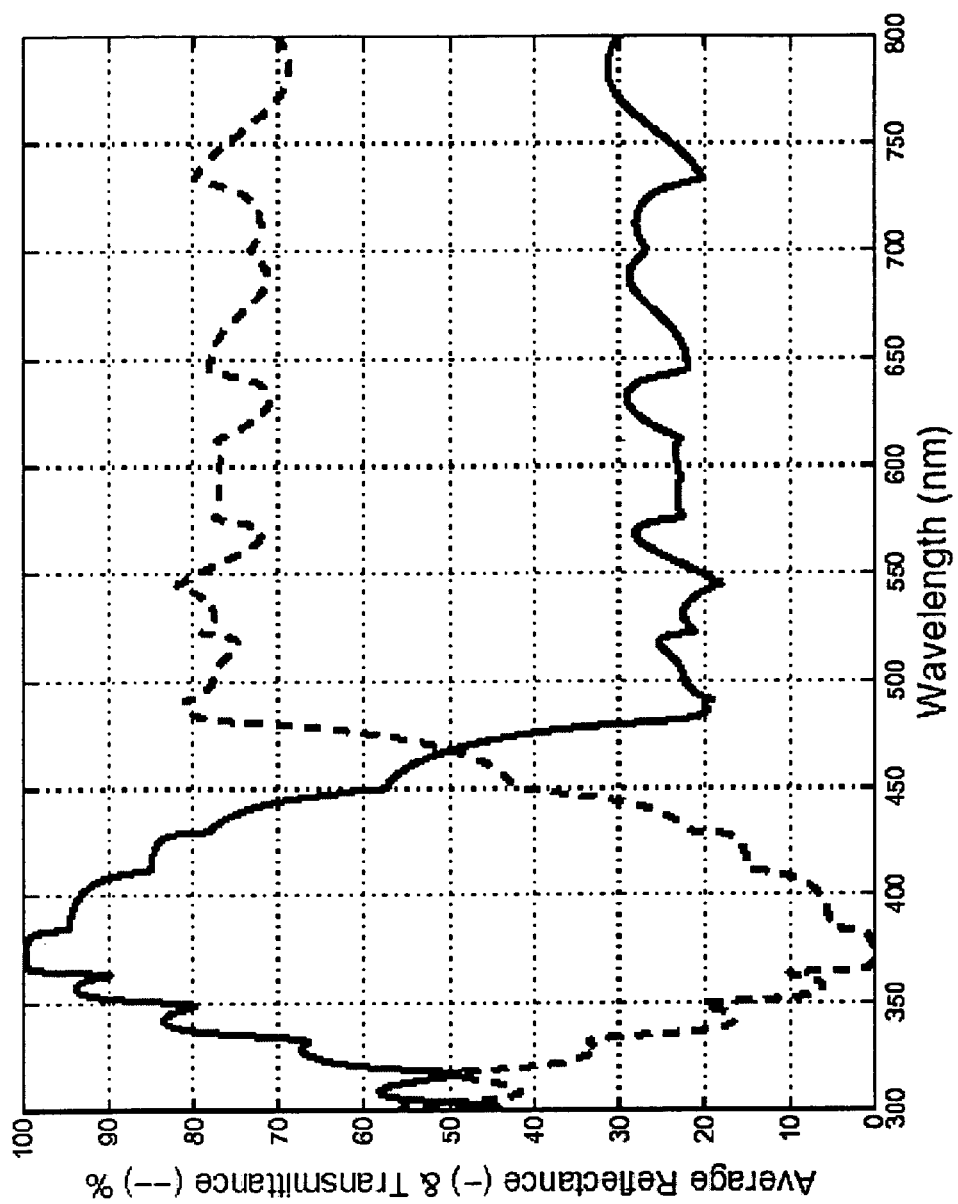
FIG. 11 is a graph showing the average reflectance and transmittance as a function of wavelength by taking all incident angles and polarizations into account when the incident wave comes from air.

FIG. 11 shows the average reflectance and transmittance of the omnidirectional reflectors 6 as a function of wavelength by taking all incident angles and polarizations into account when the incident wave comes from air. The reflectance is up to 99% between wavelength 366 nm and 378 nm, which matches the expectation for the omnidirectional photonic bandgap in FIG. 10.

Figure 4:
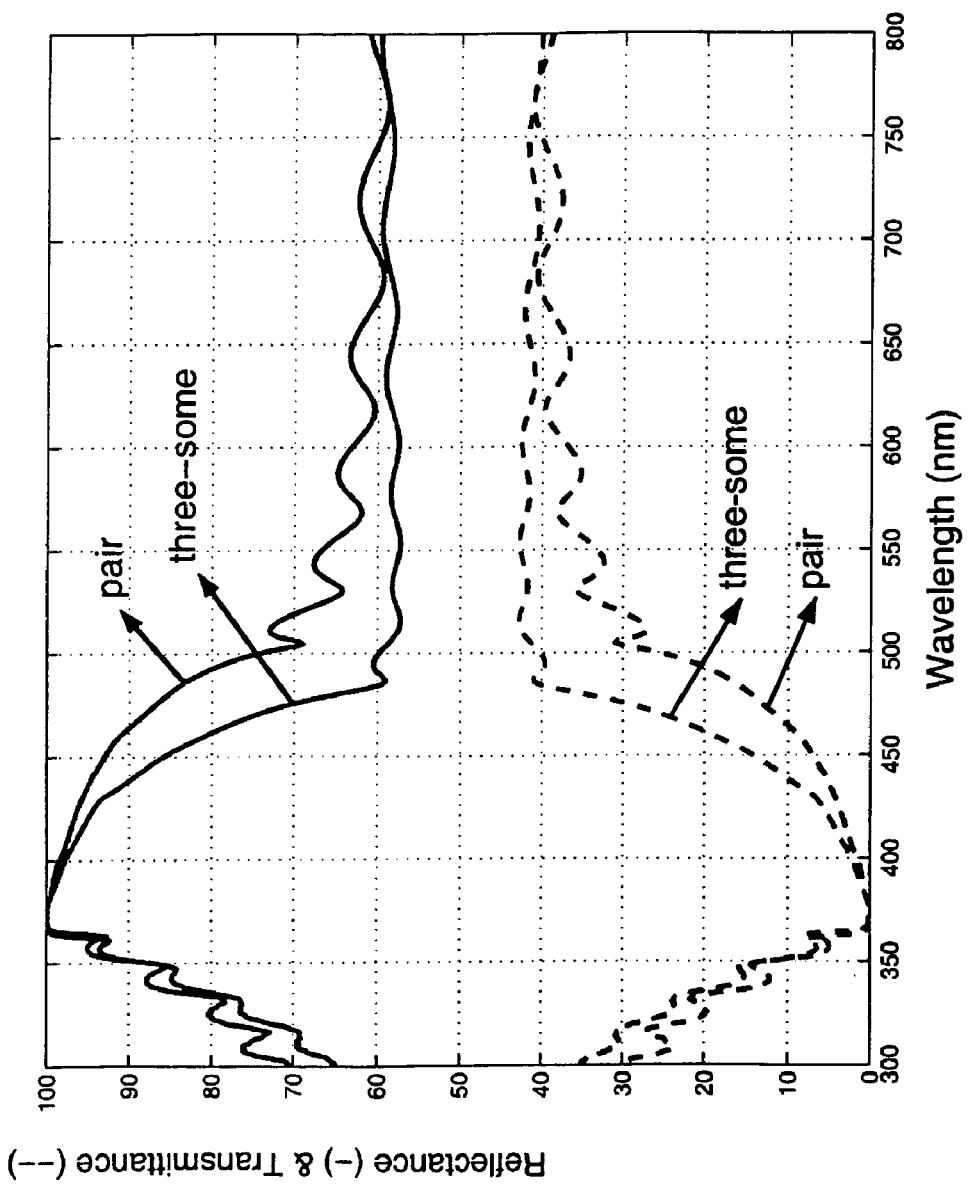
FIG. 4 is a comparison graph showing the average reflectance and transmittance as a function of wavelength by taking all incident angles and polarizations into account for two different omnidirectional reflectors on the same light emitting device of the first preferred embodiment.

After optimizing the performance of the omnidirectional reflectors, FIG. 4 is a comparison graph of average transmittance and reflectance as a function of wavelength for the omnidirectional reflect or 6 made from $TiO_2/SiO_2/Ta_2O_5$, (three-some), and the omnidirectional reflector made from $TiO_2/SiO_2$(pair) when the incident light comes from the wavelength-converting member 4. The omnidirectional reflector 6 of $TiO_2/SiO_2/Ta_2O_5$ has a narrower wavelength peak than that of the omnidirectional reflector 6 of $TiO_2/SiO_2$, and is more efficient in transmitting the secondary light in the visible range therethrough without reducing the reflectance of the primary light, such as the light in the UV range, back to the wavelength-converting member 4.

The light-generating element 511 is in the form of a light emitting diode, such as organic light emitting diode or polymer light emitting diode, which emits the primary light within a wavelength range between 350 and 470 nm. The wavelength-converting member 4 includes a transparent resin matrix with a fluorescent material, such as particles of a phosphor material, dispersed therein. In the first preferred embodiment, the wavelength-converting member 4 is a mixture of the fluorescent material and a silicon material in a ratio of 1:20. The fluorescent material is composed of three primary color (red, green and blue) materials, and is capable of converting the primary light into the secondary light within a wavelength range between 400 and 700 nm.

Conventionally, there is a reflective metal layer located on the bottom of the light emitting unit to reflect the primary and secondary lights back to the wavelength-converting member. However, if the primary light is within UV range, the reflective metal layer will absorb a portion of the primary light, which, in turn, results in decrease in the efficiency of the light emitting device. Referring again to FIG. 2, instead of absorbed by the reflective metal layer, the primary light will be totally reflected by the second omnidirectional reflector 6. In addition, a reflective metal layer 71 is attached to the lower surface of the second omnidirectional reflector 6 to reflect the secondary light back to the wavelength-converting member 4. Therefore, the second omnidirectional reflector 6 combined with a reflective metal layer 71 will further enhance the efficiency of the light emitting device. Note that the main function of the second omnidirectional reflector 6 is to totally reflect the primary light back to the wavelength-converting member 4. As such, the second reflector 6 can be made from omnidirectional one-dimensional photonic crystals that are composed of two materials only (e.g. $TiO_2/SiO_2$).

Figure 5:
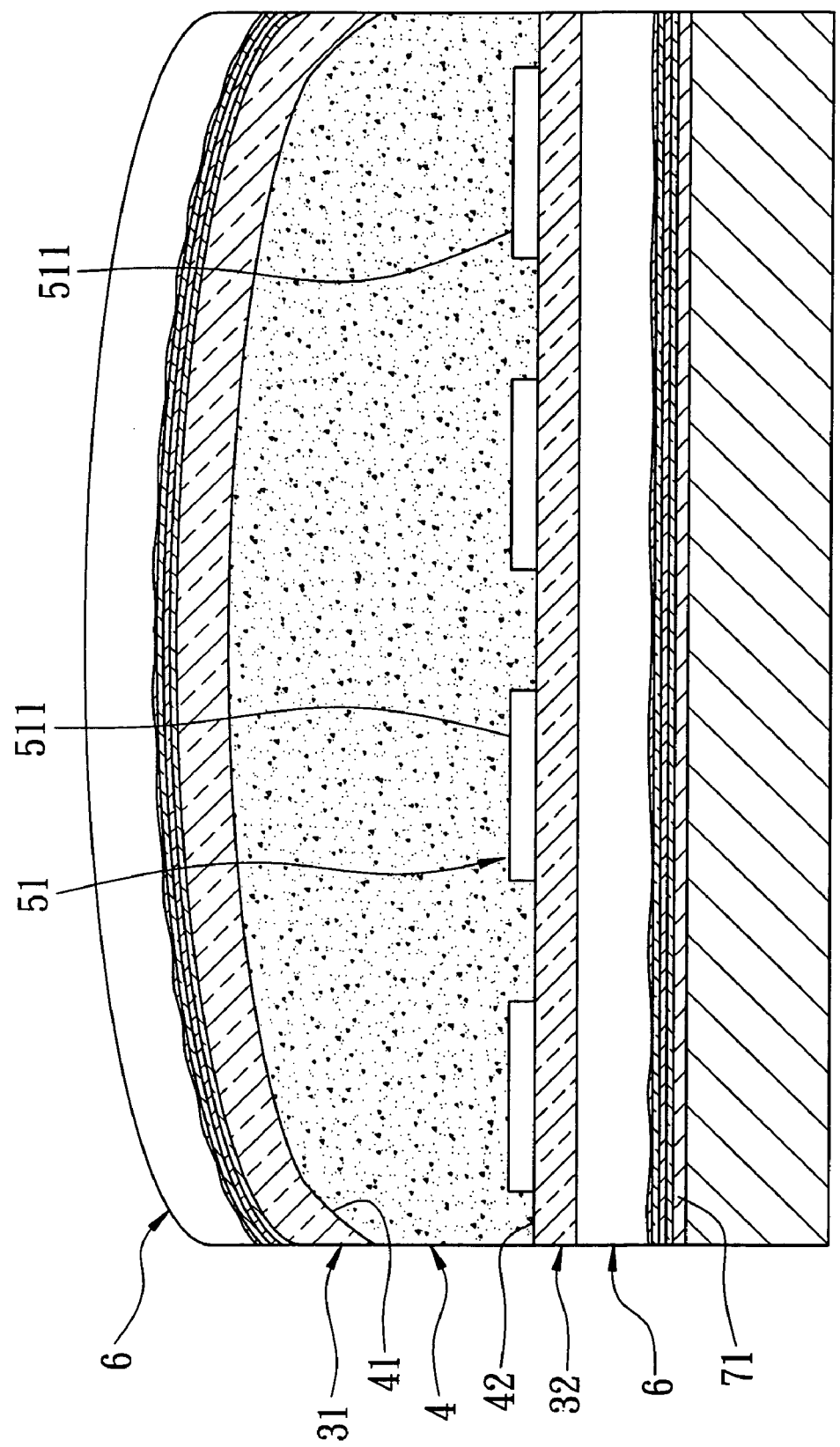
FIG. 5 is a schematic, fragmentary sectional view of the second preferred embodiment of the light emitting device according the present invention.

FIG. 5 illustrates the second preferred embodiment of the light emitting device of this invention, which is similar to the first preferred embodiment, except that the wavelength-converting member 4 and the first omnidirectional reflector 6 have a generally dome-shaped structure to increase the transmittance of the secondary light therethrough to further enhance the efficiency of the light emitting device.

Figure 6:
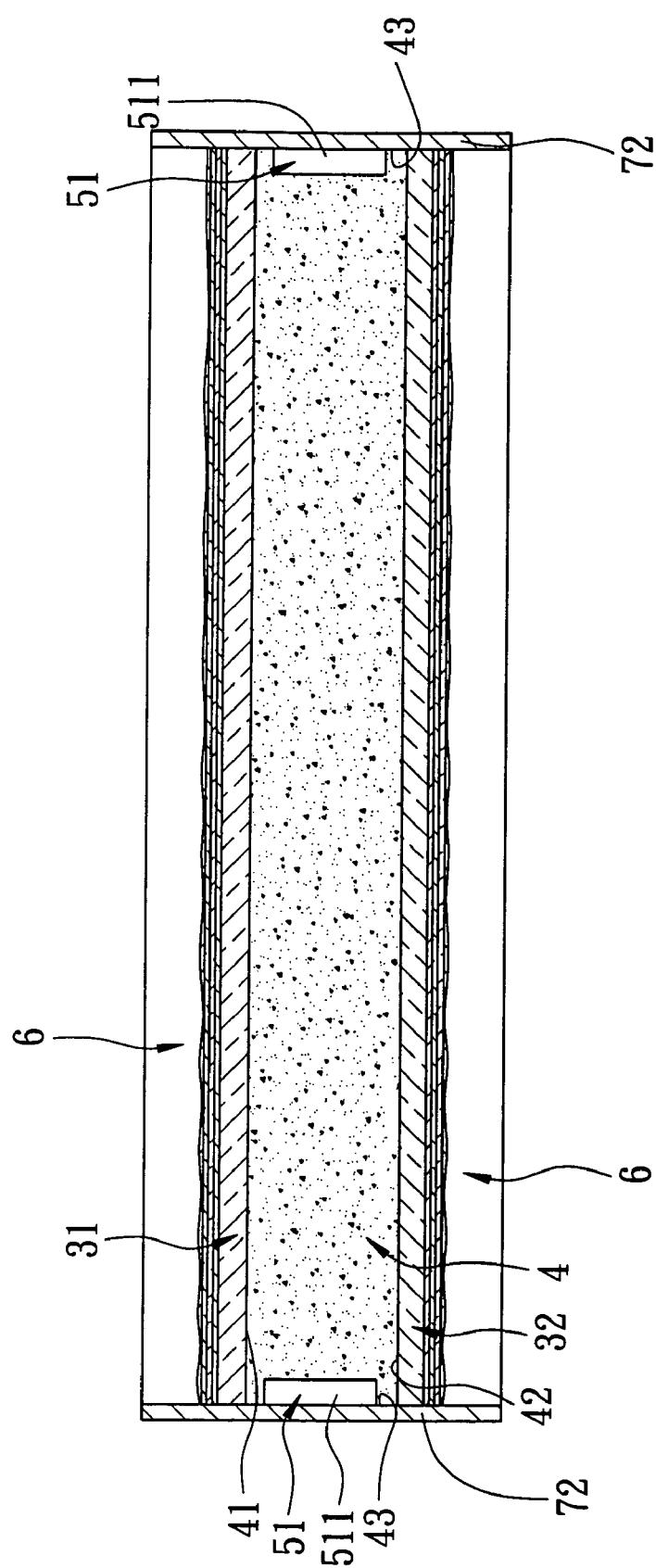
FIG. 6 is a schematic side view of the third preferred embodiment of the light emitting device according the present invention.
Figure 7:
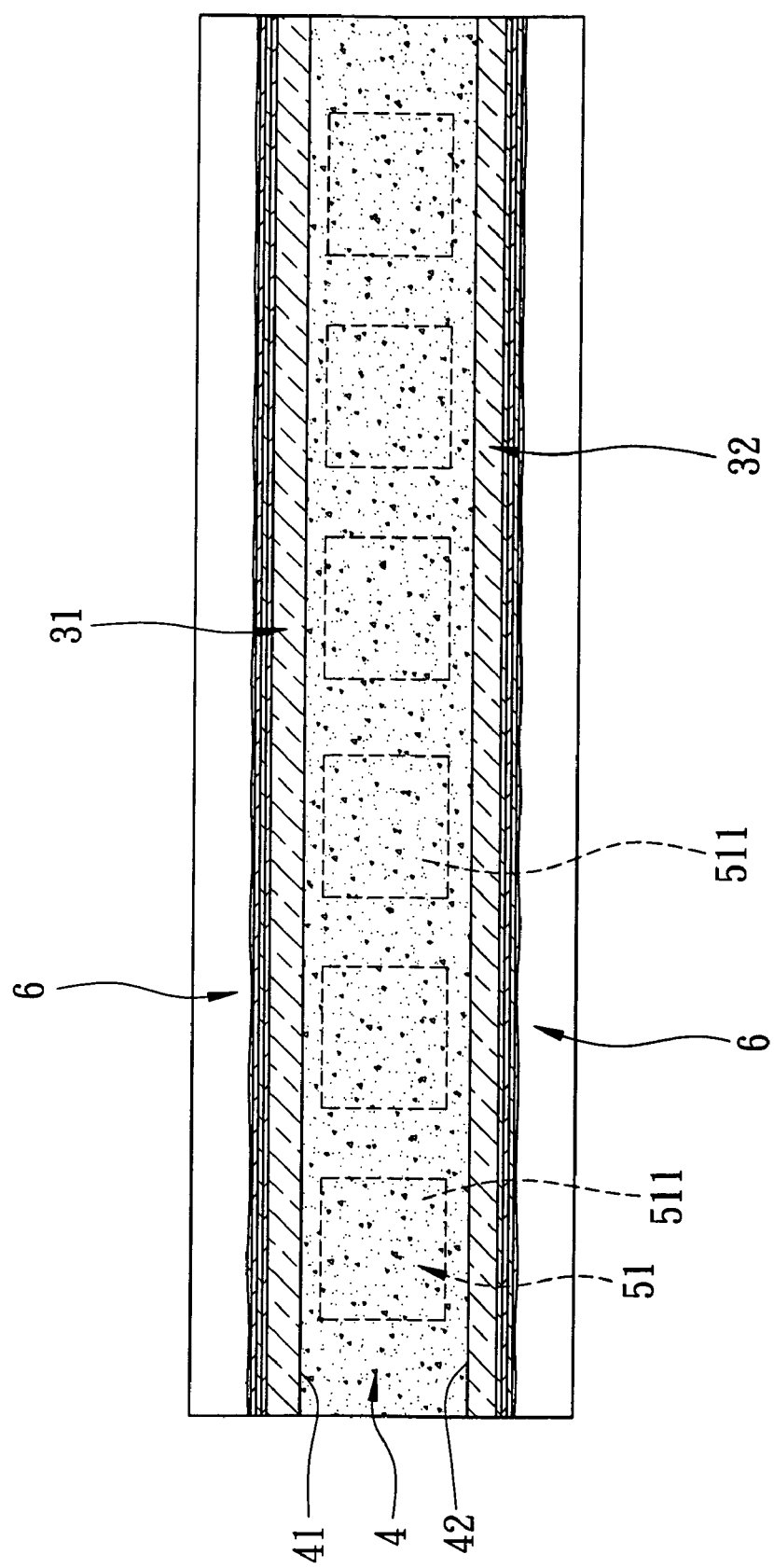
FIG. 7 is a schematic sectional view of the third preferred embodiment of the light emitting device according the present invention, which is viewed from another side of the light emitting device.

FIGS. 6 and 7 illustrate the third preferred embodiment of the light emitting device of this invention, which differs from the first embodiment in that the wavelength-converting member 4 has opposite upper and lower surfaces 41, 42 and left and right side faces 43. The light-generating unit 51 includes a left row of light-generating elements 511 that are inlaid in the left side face 43 of the wavelength-converting member 4, and a right row of light-generating elements 511 that are inlaid in the right side face 43 of the wavelength-converting member 4. The second glass substrate 32 is attached to the lower surface 42 of the wavelength-converting member 4. The first glass substrate 31 is attached to the upper surface 41 of the wavelength-converting member 4. The first and second omnidirectional reflectors 6 are respectively attached to the first and second glass substrates 31, 32. Left and right reflective metal layers 72 are attached to the left and right side faces 43 of the wavelength-converting member 4 and respectively cover the left and right rows of the light-generating elements 511.

Figure 8:
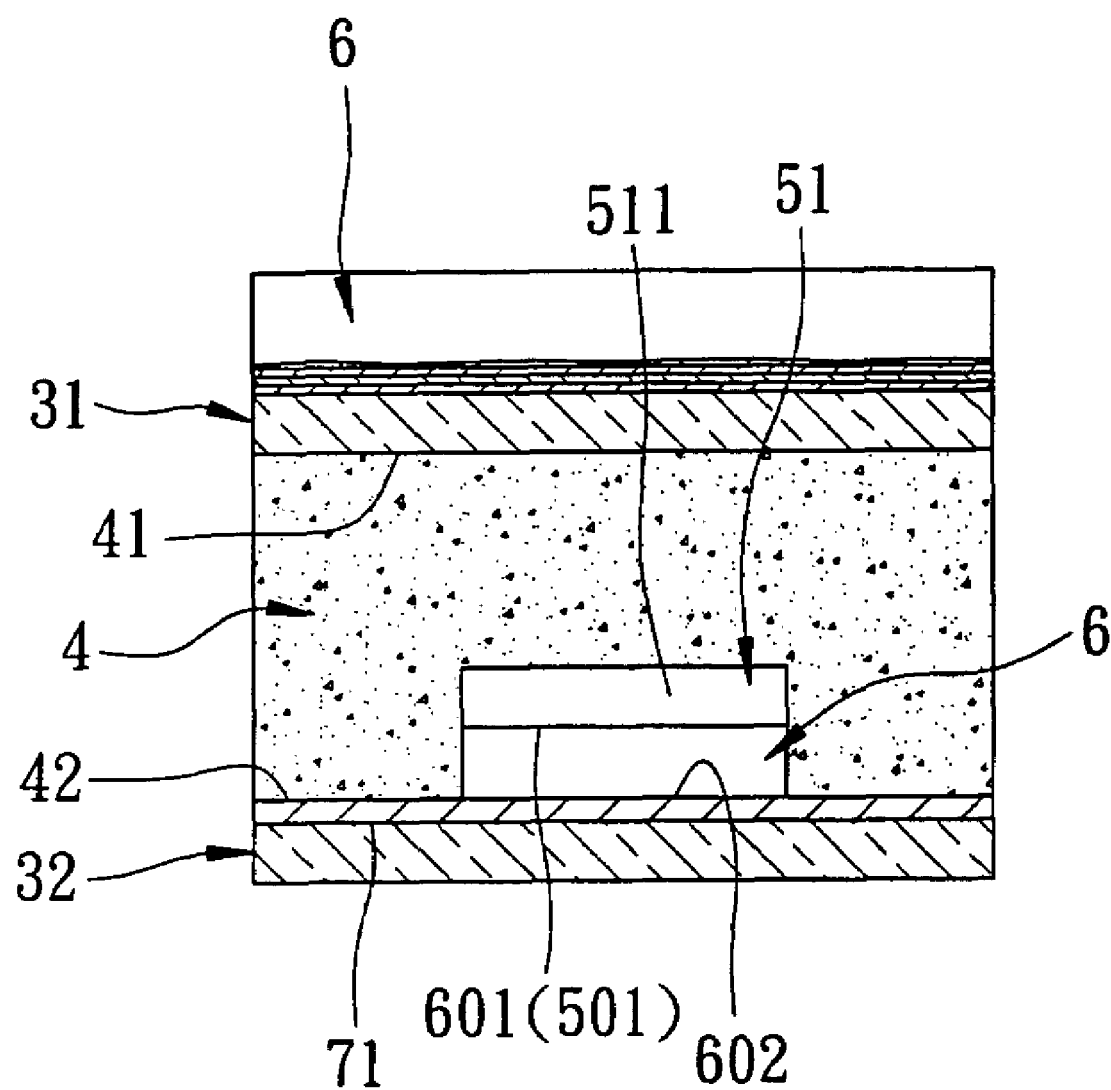
FIG. 8 is a schematic view of the fourth preferred embodiment of the light emitting device according the present invention.

FIG. 8 illustrates the fourth preferred embodiment of the light emitting device of this invention, which is similar to the first embodiment, except that the light-generating elements 511 and the second omnidirectional reflector 6 are inlaid in the lower surface 42 of the wavelength-converting member 4 in such a manner that an upper surface 601 of the second omnidirectional reflector 6 is attached to a lower surface 501 of each light-generating element 511, and a lower surface 602 of the second omnidirectional Reflector 6, which is opposite to the upper surface 601 of the second reflector 6, is flush with the lower surface 42 of the wavelength-converting member 4, and that the reflective metal layer 71 is attached to the lower surface 42 of the wavelength-converting member 4 and covers the lower surface 602 of the reflector 6. The second glass substrate 32 is attached to and covers the reflective metal layer 71.

Figure 9:
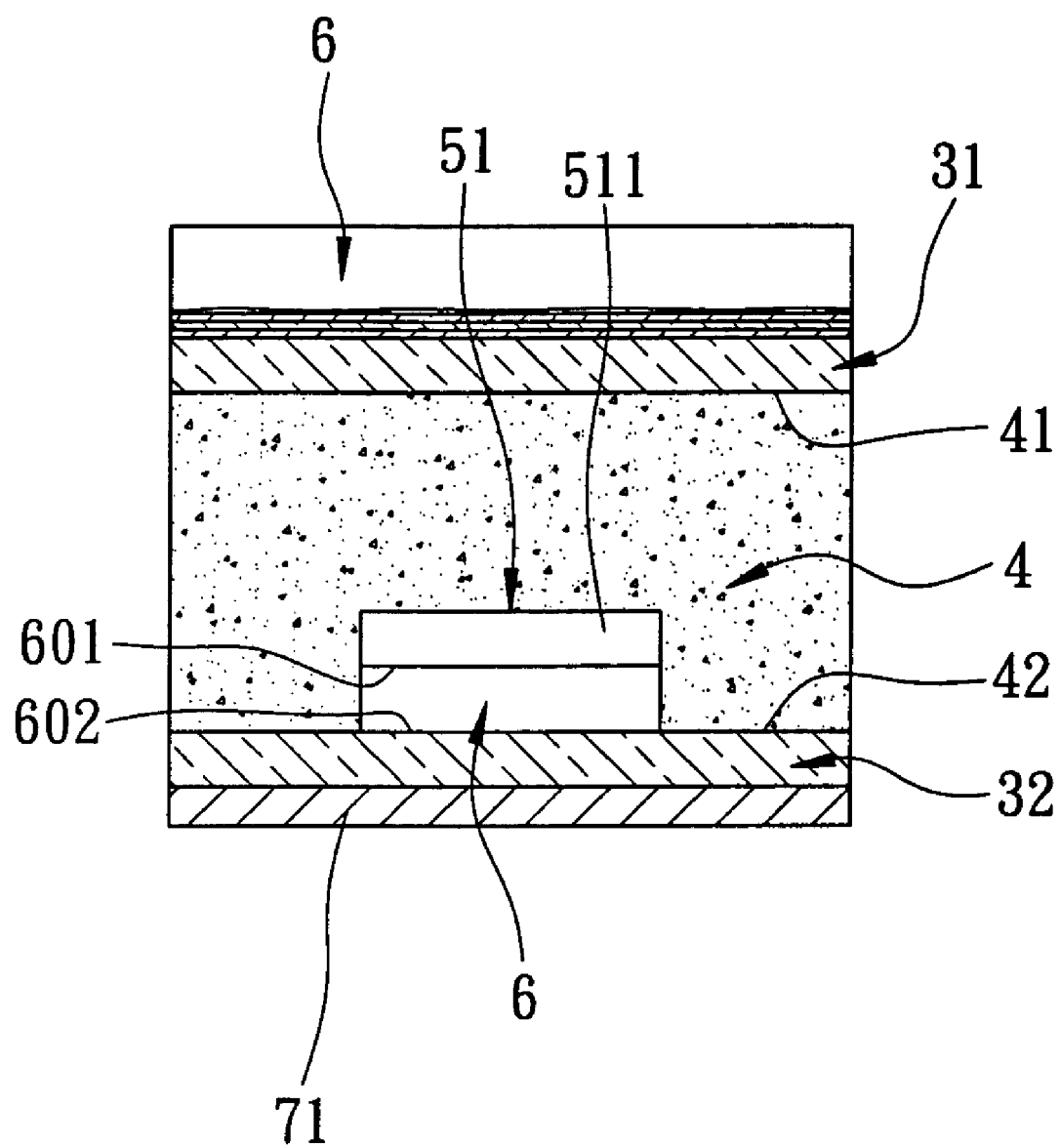
FIG. 9 is a schematic view of the fifth preferred embodiment of the light emitting device according the present invention.

FIG. 9 illustrates the fifth preferred embodiment of the light emitting device of this invention, which is similar to the fourth embodiment, except that the second glass substrate 32 is attached to the lower surface 42 of the wavelength-converting member 4 and covers the lower surface 602 of the omnidirectional reflector 6 and that the reflective metal layer 71 is attached to and covers the second glass substrate 32.

Since the construction of the omnidirectional reflector(s) 6 in the light emitting device of this invention substantially permits total reflection of the primary light with any incident angle and polarization from the light emitting unit 51 back to the wavelength-converting member 4, the aforesaid drawbacks associated with the prior art can be eliminated.

By virtue of the three-some structure of the omnidirectional one-dimensional photonic crystal, i.e., the first, second and third dielectric layers 611, 612, 613, which are different from each other in refractive index and layer thickness, the omnidirectional reflector made thereof has a narrower wavelength peak in reflectance vs wavelength (see FIG. 4) than that of the omnidirectional reflector with a pair structure.

With the invention thus explained, it is apparent that various modifications and variations can be made without departing from the spirit of the present invention.

I claim:
1. A light emitting device comprising:
a light-generating unit for generating a primary light in a first wavelength range;
a wavelength-converting member connected to said light-generating unit, wherein the wavelength-converting member has a material layer used to convert a portion of said primary light into a secondary light in a second wavelength range wherein said primary light in wavelength is shorter than said secondary light; and
at least an omnidirectional reflector of an omnidirectional photonic crystal connected to said wavelength-converting member for receiving said secondary light and the remainder of said primary light which was not converted by said wavelength-converting member;
wherein said reflector includes a dielectric structure having a plurality of dielectric units that are formed into a stack with a spatially periodic variation in dielectric constant, each of the dielectric units including at least three dielectric layers which are different from each other in reflective index and layer thickness in such a manner that said reflector has a transmittance characteristic that permits transmission of said secondary light therethrough, and a reflectance characteristic that substantially permits omnidirectional total reflection of the remainder of said primary light back to said wavelength-converting member.

2. The light emitting device of claim 1, wherein said dielectric layers includes first, second and third dielectric layers, said second dielectric layer being sandwiched between said first and third dielectric layers and having a refractive index less than those of said first and third dielectric layers, said third dielectric layer having a refractive index less than that of said first dielectric layer.

3. The light emitting device of claim 2, wherein said first dielectric layer is made from $TiO_2$, said second dielectric layer being made from $SiO_2$, said third dielectric layer being made from $Ta_2O_5$.

4. The light emitting device of claim 1, wherein said light-generating unit is inlaid at one side of said wavelength-converting member, said reflector being disposed at an opposite side of said wavelength-converting member that is opposite to said one side of said wavelength-converting member.

5. The light emitting device of claim 4, further comprising a second omnidirectional reflector, and first and second glass substrates that sandwich said light-generating unit and said wavelength-converting member therebetween, said wavelength-converting member having opposite upper and lower surfaces, said light-generating unit including an one or two dimensional arrays of light-generating elements that are inlaid in said lower surface of said wavelength-converting member, said second glass substrate being formed on said lower surface of said wavelength-converting member and covering said light-generating unit, said first glass substrate being formed on said upper surface of said wavelength-converting member, said first and second reflectors being respectively formed on said first and second glass substrates.

6. The light emitting device of claim 5, wherein said second reflector includes at least one dielectric unit that has at least two dielectric layers which are different from each other in refractive index and layer thickness.

7. The light emitting device of claim 6, further comprising a reflective metal layer that is formed on said second reflector.

8. The light emitting device of claim 5, wherein each of said light-generating elements is in the form of a light emitting diode that emits said primary light with a wavelength ranging from 350 to 470 nm.

9. The light emitting device of claim 8, wherein said wavelength-converting member includes a transparent resin matrix with a fluorescent material dispersed therein so as to convert said primary light into said secondary light with a wavelength ranging from 400 to 700 nm.

* * * * *